(12) United States Patent
Biskup

(10) Patent No.: US 9,041,454 B2
(45) Date of Patent: May 26, 2015

(54) BIAS CIRCUIT FOR A SWITCHED CAPACITOR LEVEL SHIFTER

(71) Applicant: Atieva, Inc., Redwood City, CA (US)

(72) Inventor: Richard J. Biskup, Redwood City, CA (US)

(73) Assignee: ATIEVA, Inc., Redwood City, CA (US)

( * ) Notice: Subject to any disclaimer, the term of this patent is extended or adjusted under 35 U.S.C. 154(b) by 0 days.

(21) Appl. No.: 13/835,377

(22) Filed: Mar. 15, 2013

(65) Prior Publication Data

US 2014/0266381 A1 Sep. 18, 2014

(51) Int. Cl.
*H03K 5/08* (2006.01)
*H03K 17/16* (2006.01)
*G01R 19/00* (2006.01)
*G01R 19/165* (2006.01)

(52) U.S. Cl.
CPC .......... *H03K 17/162* (2013.01); *G01R 19/0084* (2013.01); *G01R 19/16542* (2013.01)

(58) Field of Classification Search
USPC ......................................... 327/318, 325, 333
See application file for complete search history.

(56) References Cited

U.S. PATENT DOCUMENTS

| 4,760,434 | A  | * | 7/1988 | Tsuzuki et al. ................. 257/49 |
| 5,079,608 | A  | * | 1/1992 | Wodarczyk et al. .......... 257/355 |
| 6,108,219 | A  | * | 8/2000 | French ............................ 363/23 |
| 6,172,383 | B1 | * | 1/2001 | Williams ...................... 257/173 |
| 6,286,491 | B1 | * | 9/2001 | Fukatsu et al. ............... 123/644 |
| 7,288,919 | B2 |   | 10/2007 | Morita |
| 7,459,885 | B2 |   | 12/2008 | Miyamoto |
| 7,768,034 | B2 | * | 8/2010 | Calafut et al. ................ 257/173 |
| 7,839,217 | B2 |   | 11/2010 | Okuma |
| 8,106,706 | B2 |   | 1/2012 | Easwaran et al. |
| 8,174,237 | B2 |   | 5/2012 | Kosugi et al. |
| 8,212,571 | B2 |   | 7/2012 | Emori et al. |
| 8,222,863 | B2 |   | 7/2012 | Sakakibara |
| 8,231,996 | B2 |   | 7/2012 | Howard et al. |

(Continued)

FOREIGN PATENT DOCUMENTS

| EP | 1676427 | 8/2012 |
| EP | 2506390 | 10/2012 |

(Continued)

OTHER PUBLICATIONS

Goodenough, Frank. "Isolate, Amplify, Multiplex 4+ Channels," Analog Dialogue, 1980, pp. 3-4, vol. 14, No. 2.

(Continued)

*Primary Examiner* — Kenneth B Wells
(74) *Attorney, Agent, or Firm* — Womble, Carlyle, Sandridge & Rice

(57) ABSTRACT

A noise resistant switch control circuit is provided. The circuit includes a low pass filter configured to couple to a first terminal of a switch and a first voltage clamp coupled to the low pass filter. The first voltage clamp is configured to couple to a control terminal of the switch and limit a voltage of the control terminal relative to the first terminal to within a first clamping range. The circuit includes a second voltage clamp coupled to an input terminal of the switch control circuit. The second voltage clamp is configured to couple to the control terminal of the switch. The second voltage clamp is further configured to reduce a level of a control voltage coupled to the second voltage clamp. The circuit includes a bias device configured to couple to the control terminal of the switch and to impress a biasing voltage to the control terminal.

20 Claims, 3 Drawing Sheets

(56) References Cited

U.S. PATENT DOCUMENTS

| | | |
|---|---|---|
| 8,354,186 B2 | 1/2013 | Muis |
| 8,542,056 B2 | 9/2013 | Rossi et al. |
| 8,586,230 B2 | 11/2013 | Kim et al. |
| 8,598,939 B2 | 12/2013 | Shimizu et al. |
| 8,786,261 B2 | 7/2014 | Andrea |
| 2013/0052514 A1 | 2/2013 | Kim |

FOREIGN PATENT DOCUMENTS

| | | |
|---|---|---|
| EP | 2538513 | 12/2012 |
| JP | 2003309982 | 10/2003 |
| JP | 2010183766 | 8/2010 |
| JP | 2012208068 | 10/2012 |
| KR | 1020060111946 | 10/2006 |
| KR | 1020100088369 | 8/2010 |
| KR | 1020110056699 | 5/2011 |
| KR | 1020120055241 | 5/2012 |
| WO | WO 2011072939 | 6/2011 |

OTHER PUBLICATIONS

Notification of Transmittal of the International Search Report and Written Opinion of the International Searching Authority, PCT/US2014/028636, mailed Aug. 26, 2014.

Notification of Transmittal of the International Search Report and Written Opinion of the International Searching Authority, PCT/US2014/028658, mailed Aug. 13, 2014.

Regarding related patents and patent applications, see the section of the accompanying IDS letter entitled "Related Patents and Patent Applications" for further information.

International Search Report, PCT/US2014/028616, mailed Jul. 7, 2014.

International Search Report, PCTUS2014/025518, mailed Jun. 18, 2014.

International Search Report, PCT/US2014/022807, mailed Jul. 3, 2014.

* cited by examiner

BIAS CIRCUIT FOR A SWITCHED CAPACITOR LEVEL SHIFTER

BACKGROUND

An electrically noisy environment can wreak havoc on electronic circuits. For example, with a switched capacitor level shifter, electrical noise on switch control terminals or on other switch terminals can cause switches to activate when they shouldn't, or not activate when they should, thereby disrupting operation of the capacitors that are being switched. Charge can get transferred when the charge should not be transferred, because a switch is activated when the switch should not be activated. Charge can fail to get transferred when the charge should be transferred, because a switch is deactivated when the switch should be active. Because of situations like this, incorrect voltages can be placed on the capacitors, decreasing or ruining accuracy of any voltage measurement of a level-translated voltage. Problems such as these are particularly seen in electronic circuits in electric or hybrid automobiles, as well as other types of electric vehicles whether land, water, or air based.

It is within these contexts that the embodiments arise.

SUMMARY

In one embodiment, a noise resistant, switch control circuit is provided. The circuit includes a low pass filter configured to couple to a first terminal of a switch. The circuit includes a first voltage clamp coupled to the low pass filter, the first voltage clamp configured to couple to a control terminal of the switch and to limit a voltage of the control terminal relative to the first terminal to within a first clamping range. The circuit includes a second voltage clamp coupled to an input terminal of the switch control circuit. The second voltage clamp is configured to couple to the control terminal of the switch. The second voltage clamp is further configured to reduce a level of a control voltage coupled to the second voltage clamp. The circuit includes a bias device configured to couple to the control terminal of the switch and to impress a biasing voltage to the control terminal.

In another embodiment, a noise-resistant switching device is provided. The switching device includes a switch having a first terminal, a second terminal and a control terminal, wherein the first terminal and the second terminal are coupled together in response to the control terminal being within an activation voltage range relative to the first terminal. The switching device includes an AC (alternating current) coupling device having a first terminal as an input terminal of the noise-resistant switching device. The switching device includes a first voltage clamp and a second voltage clamp. The first voltage clamp is coupled to the control terminal and the first terminal of the switch. The first voltage clamp is operable to clamp a voltage of the control terminal to a first clamping voltage relative to the first terminal of the switch. The second voltage clamp is coupled to a second terminal of the AC coupling device. The second voltage clamp is coupled to the control terminal of the switch. The second voltage clamp is configured to urge a voltage of the control terminal towards a voltage on the second terminal of the AC coupling device in response to the voltage on the second terminal of the AC coupling device being greater in magnitude than a second clamping voltage. The switching device includes a low pass filter having an output coupled to the first terminal of the switch and a bias device coupled to the control terminal and the first terminal of the switch.

In yet another embodiment, a noise resistant switched capacitor level shifter is provided. The level shifter includes a first capacitor, a second capacitor, a first switch coupled to a first terminal of the level shifter and coupled to a first terminal of the first capacitor, and a second switch coupled to the first terminal of the first capacitor and coupled to a first terminal of the second capacitor. The level shifter includes a third switch coupled to a third terminal of the level shifter and coupled to a second terminal of the first capacitor and a fourth switch coupled to the second terminal of the first capacitor and coupled to a second terminal of the second capacitor. The level shifter includes a first AC (alternating current) coupling and DC (direct current) biasing device coupled to a control terminal of the first switch and a second AC coupling and DC biasing device coupled to a control terminal of the third switch. The first and second devices are configured to DC bias the control terminal of respective first or third switch and to pass an AC coupled, voltage clamped version of a first clock signal to the control terminal of the respective first or third switch. The first and second devices are operable to clamp a voltage at the control terminal of respective first or third switch to within a clamping range. The second switch and the fourth switch are configured to couple to a second clock signal.

In one embodiment, a method for controlling a switch is provided. The method includes biasing a control terminal of a switch to within one of an activating voltage range or a deactivating voltage range and AC (alternating current) coupling an input signal, to produce an AC coupled version of the input signal. The method includes voltage clamping the AC coupled version of the input signal, to produce a reduced AC coupled version of the input signal in response to the AC coupled version of the input signal exceeding a second clamping range The method includes voltage clamping the reduced AC coupled version of the input signal, to produce a voltage clamped AC coupled version of the input signal and applying the voltage clamped AC coupled version of the input signal to the control terminal of the switch.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A switched capacitor level shifter that has noise-resistant circuitry is described below. The embodiments provide an apparatus and technique to dynamically set the gate bias voltage on a pair of transistors in a switched capacitor level shifter. Through the embodiments, the switching elements of the apparatus may be controlled with a high degree of confidence in the presence of common mode noise. This application is related to U.S. application Ser. No. 13/794,535 filed Mar. 11, 2013, Ser. No. 13/834,983 filed Mar. 15, 2013, Ser. No. 13/835,170 filed Mar. 15, 2013, Ser. No. 13/835,595 filed Mar. 15, 2013, and Ser. No. 13/835,760 filed Mar. 15, 2013, each of which is incorporated herein by reference for all purposes.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
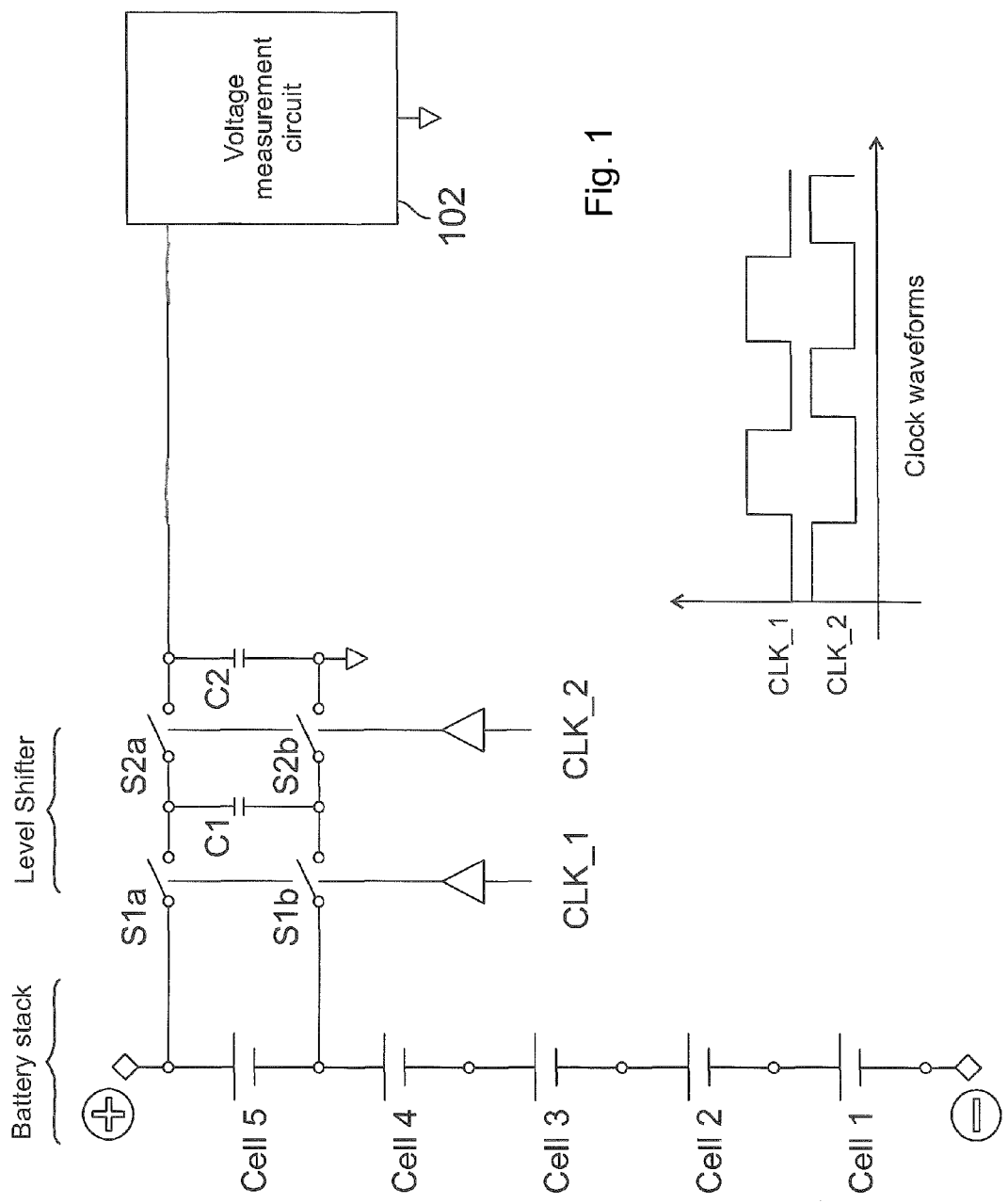
FIG. 1 is a schematic diagram of a switched capacitor level shifter.

As shown in FIG. 1, one application for a switched capacitor level shifter is in measuring cell voltage in a battery stack. Of course, level shifters can be used for many other purposes and functions as well. Here, the switches S1a, S2a, S1b, S2b are activated and deactivated by nonoverlapping clocks, and charge is transferred from an input port of the level shifter to the first capacitor C1 and from the first capacitor C1 to the second capacitor C2. The second capacitor C2 is referenced to ground, so that the voltage from Cell 5 is level shifted downward to become a ground-referenced voltage, seen at the output port of the level shifter and measured by the voltage measurement circuit 102. Ideal or noise-free operation is described below, followed by description of operation in an electrically noisy environment.

Switch S1a and switch S1b are activated by an active level on a first clock CLK_1. In this example, the switches are closed when the clock has a logical one value. When switch S1a and switch S1b are closed, the voltage of Cell 5 in the battery stack is expressed upon the first capacitor C1. Next, switch S1a and switch S1b are deactivated by an inactive level on the first clock CLK_1. In this example, the switches are opened when the corresponding clock signal has a logical zero value. Next, switch S2a and switch S2b are activated by an active level on a second clock CLK_2. In this example, the switches are opened when the clock is a logical one value. The open switches result in the first and second capacitors C1, C2 being coupled together and their respective voltages equalized. With repeated cycles of switch activations and deactivations, the voltage across capacitor C2 approaches the voltage of Cell 5. An accurate measurement of the voltage across the second capacitor C2 is made by the voltage measurement circuit 102, and this represents the voltage of Cell 5.

If the battery stack is in an electrically noisy environment, such as an electric or hybrid automobile or other applications, there can be voltage spikes and/or peak to peak noise voltages at various frequencies on the cell terminals in the battery stack. These noisy voltages can readily turn on and off a MOSFET (metal oxide semiconductor field effect transistor) that is implementing one of the switches, as these voltages can exceed a threshold voltage of a MOSFET. This condition can result in shorting a cell terminal to ground, as when switches S1b and S2b are activated at the same time, or overcharging the second capacitor C2, as when the switches S1a and S2a are activated at the same time. The latter situation could damage the voltage measurement circuit 102. Further details on the switched capacitor level shifter are provided in application Ser. No. 13/835,170, which is incorporated herein by reference for all purposes.

Figure 2:
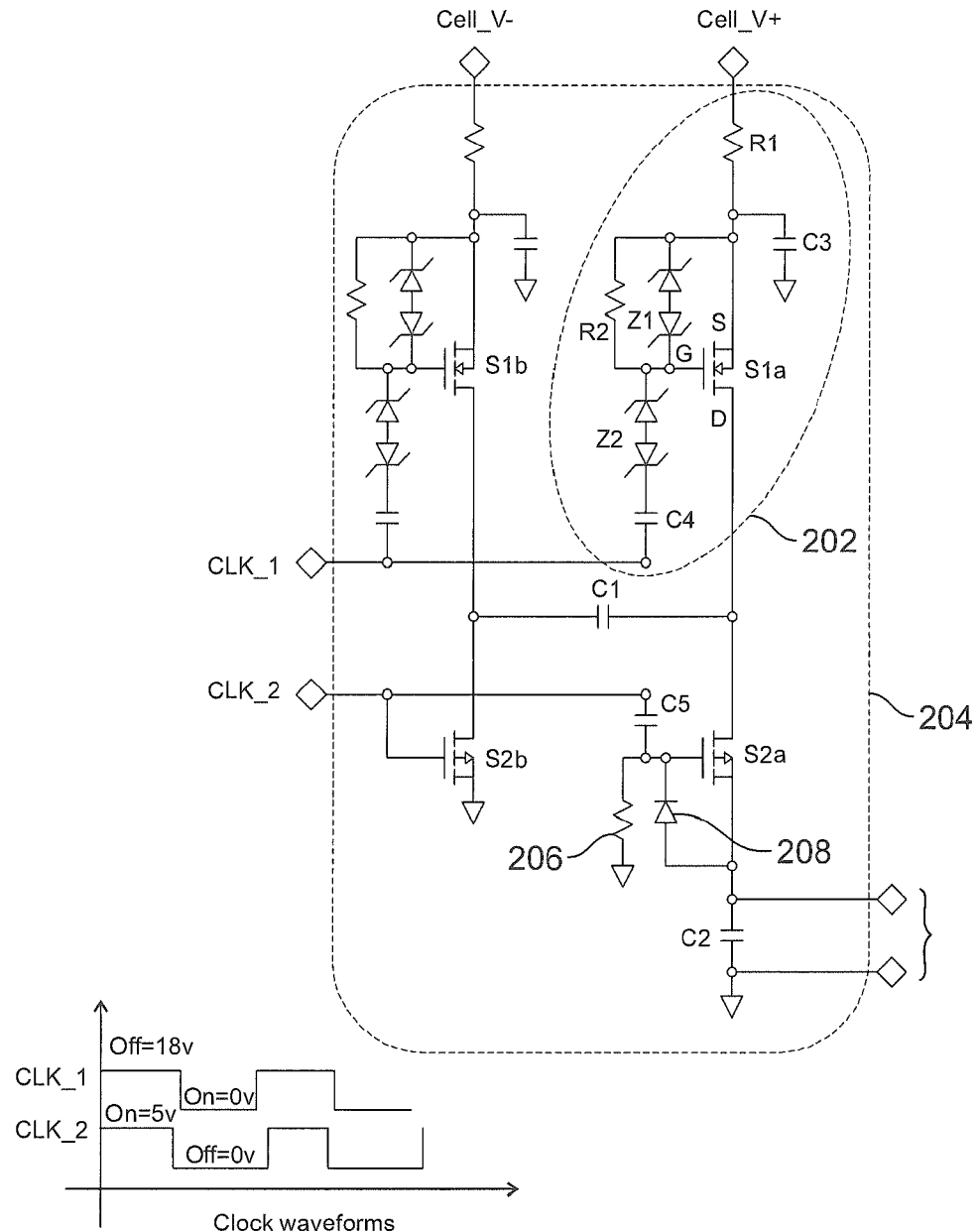
FIG. 2 is a schematic diagram of a switched capacitor level shifter, with noise-resistant circuitry in accordance with the present invention.

In FIG. 2, a noise-resistant circuit is applied to each of switches S1a, S1b in a switched capacitor level shifter 204, thereby providing a noise resistant switched capacitor level shifter suitable for electrically noisy environments. The noise resistant circuit is illustrated as a switch control circuit, and applying the switch control circuit to a switch S1a produces a noise-resistant switching device 202, which can be integrated with each respective switch of switched capacitor level shifter 204. The noise resistant circuit described herein employs voltage clamps, filters, AC coupling and biasing in ways that reject noise and condition a control voltage for a switch so as to operate in an electrically noisy environment. The noise resistant circuit applied to switches S1a and S1b can be referred to as an AC coupling, voltage clamping, low pass filtering and DC biasing device coupled to a control terminal of the switch.

Still referring to FIG. 2, a terminal of the switching device 202 is also a terminal of the level shifter 204, and is shown connected to a positive terminal Cell_V+ of a cell in a battery stack. The cell voltage is filtered through a low pass filter that includes resistor R1 in series with capacitor C3. This low pass filter has a corner frequency of 7.2 kHz, in this example, and attenuates common mode noise above about 10 kHz. It should be appreciated that the frequencies are not meant to be limiting as the low pass filter may operate at other suitable frequencies depending on the application. The output of the low pass filter, which is the common node of the resistor R1 and the capacitor C3, is coupled to the source of a P type MOSFET acting as switch S1a. It should be appreciated that the low pass filter smoothes the voltage at the cell terminal, rejecting noise of frequencies higher than the low pass filter roll-off frequency. The gate terminal of the P type MOSFET acts as a control terminal of switch S1a, and the source and drain terminals of the P type MOSFET act as first and second terminals of switch S1a.

Continuing with FIG. 2, a biasing device, implemented as a resistor R2, couples the output of the low pass filter to the gate terminal of the P type MOSFET acting as switch S1a. Alternatively, the resistor R2 may be described as coupling across the source and gate terminals of the P type MOSFET. Thus, the gate of the P type MOSFET is biased to the same voltage as the source terminal of the P type MOSFET, for a gate to source value of 0 V. In this example, the P type MOSFET has a negative threshold value, and a gate to source value of 0 V biases the P type MOSFET to a deactivated state, i.e., the default value of the first switch S1a is off, which may also be referred to as open or deactivated. The resistor R2 also acts as a bleeder device, and bleeds off any charge on the gate of the P type MOSFET in the absence of a driven control signal.

In FIG. 2, a voltage clamp, implemented as back-to-back Zener diodes Z1 couples across the source and gate terminals of the P type MOSFET acting as switch S1a. This voltage clamp has high impedance when the gate to source voltage has a magnitude less than a clamping voltage. This clamping voltage is set by the sum of the Zener voltage and one diode drop, e.g., 4.7 V plus 0.6 V or 5.3 V, in one embodiment. When the gate to source voltage exceeds the clamping voltage in magnitude, i.e., the gate attempts to drop below the source voltage by more than the clamping voltage or attempts to raise above the source voltage by more than the clamping voltage, the diodes conduct a relatively large amount of current and clamp the voltage. The voltage clamp thus acts to clamp the voltage at the gate terminal of the P type MOSFET to within a clamping range of the source terminal of the P type MOSFET. This clamping action prevents the gate to source voltage from becoming large enough to damage the P type MOSFET.

The clocks that control the switches are arranged as non-overlapping clocks, as illustrated by the example clock waveforms in FIG. 2. In this example, the clock signal CLK_1 is active low in order to turn on the P type MOSFETs. Here also, a relatively large amplitude is selected for the CLK_1, e.g., CLK_1 is 18 V peak to peak. The amplitude of the clock is set to overcome large voltage spikes. In other words, the amplitude of the clock is set to have a large signal-to-noise ratio rather than the other way around. It should be appreciated that this peak to peak voltage is so large as to potentially damage MOSFETs if used directly and as described below, the switching device 202 is configured to prevent damage to the MOSFETs.

Clock signal CLK_1 is AC coupled into the switch control circuit by an AC coupling device, implemented here as capacitor C4 that blocks the DC component or offset of the clock signal CLK_1. The other end of capacitor C4 is coupled in series to a voltage clamp Z2. The voltage clamp Z2 is implemented with a set of back-to-back Zener diodes. It should be appreciated that voltage clamp Z2 operates to subtract the clamping voltage from the amplitude of the AC coupled clock signal, and pass a reduced version of the AC coupled clock signal on to the gate terminal of the P type MOSFET acting as switch S1a. Voltage clamp Z2 urges the voltage of the gate terminal of the P type MOSFET towards the voltage of the first clock CLK_1 when the difference between the gate terminal and the AC coupled clock signal becomes greater in magnitude than the clamping voltage, set by the back-to-back Zener diodes. This is alternatively described as the second voltage clamp acting to urge the control terminal towards a voltage on the second terminal of an AC coupling device, namely the capacitor C4, in response to the voltage on the second terminal of the AC coupling device being greater in magnitude than a second clamping voltage relative to the control terminal of switch S1a. Voltage clamp Z2 thus passes along to the control terminal of the switch a reduced level of a control voltage, in response to the control voltage being outside of a clamping range relative to the control terminal of the switch S1a.

The bias device, in this case resistor R2, additionally forms part of a low pass filter with the AC coupling device, namely capacitor C4. In the example shown, this filter has a corner frequency of 72 Hz (Hertz, or cycles per second). This low pass filter decouples the DC outset of the clock from the average DC value of the MOSFET gate bias. The low pass filter also ensures that the MOSFET will be turned off whenever the clock signal is stopped. The switch S1b is surrounded by circuitry similar to that of the switch S1a, which perform similar functions. It should be appreciated that the source terminals of the two P type MOSFETs acting as the first and third switches S1a, S1b are at differing voltages as a result of connections to respective cell terminals in a battery stack, or other differential voltage needing level translation. Thus, the gate terminals of the two P type MOSFETs acting as switches S1a and S1b are at differing voltages and should not be directly coupled to each other. Accordingly, each such switch has its own noise resistant circuitry.

With a first noise-resistant switching device 202 substituting for the first switch S1a, and a second noise-resistant switching device substituting for the third switch S1b of FIG. 1, a noise-resistant switched capacitor level shifter 204 can be formed as illustrated in FIG. 2. Connection of the first terminal of the level shifter 204 to the positive terminal Cell_V+ of a cell in a battery stack is as described above with reference to noise-resistant switching device 202. Similarly, the a second noise-resistant switching device substitutes for switch S1b of FIG. 1, and connects a terminal of the level shifter 204 to the negative terminal Cell_V− of the cell in the battery stack as illustrated in FIG. 2. In the embodiment of the switched capacitor level shifter 204 shown in FIG. 2, switch S2a is AC coupled to the clock signal CLK_2 through capacitor C5, and switch S2b is DC coupled (in this example, directly coupled) to the clock signal CLK_2. Switch S2a has a bleeder resistor 206 that sets a bias of 0 V on the gate of an N type MOSFET acting as switch S2a. A diode 208 prevents the gate to source voltage on this N type MOSFET from going too low, which would be more than one diode drop below 0 V in this example. Capacitors C1 and C2 are coupled to the switching devices or switches in FIG. 2 in a manner closely related to that of the capacitors C1 and C2 and the switches in FIG. 1. Additional terminals of the level shifter 204 are formed by opposed terminals of the second capacitor C2, across which the cell voltage can be measured as Measured Vcell in FIG. 2.

Figure 3:
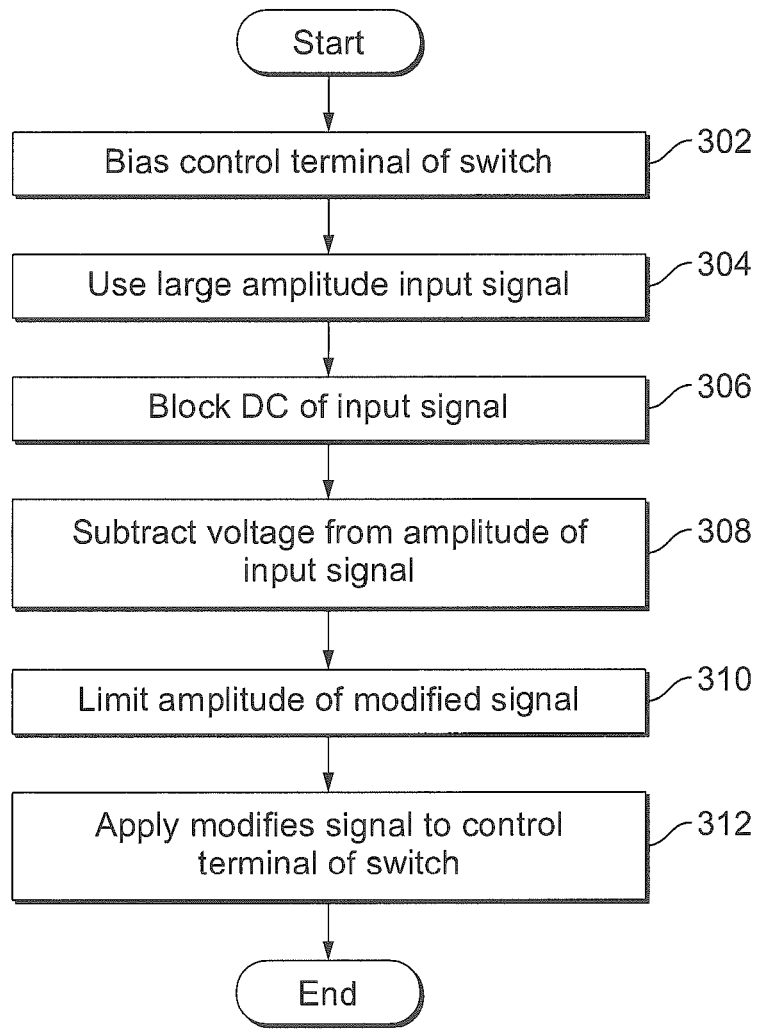
FIG. 3 is a flow diagram of a method for operating a switch in an electrically noisy environment.

FIG. 3 shows a method for operating a switch, particularly a switch in an electrically noisy environment. Following a start point, the control terminal of the switch is biased, in an action 302. For example, with reference to FIG. 2, a bias device such as a resistor R2 can couple the gate terminal of the P type MOSFET acting as a switch S1a to the output of a low pass filter such as made by resistor R1 and capacitor R3. Alternatively, the bias device can couple across the gate and source terminals of the P type MOSFET. With resistor R2 coupled across the gate and source terminals, the P type MOSFET is biased to an off or deactivated state in the absence of other control voltages. Other bias voltages, types of biasing and states of bias are readily devised.

A relatively large amplitude input signal is used, in an action 304 of FIG. 3. For example, in the circuit of FIG. 2, a signal that is 18 V peak to peak may be utilized for the first clock CLK_1. In some embodiments, the amplitude of the input signal is be chosen while keeping noise amplitudes in mind as the example of 18V peak to peak is not meant to be limiting. For example, depending on the application and the noise environment, an input signal with an amplitude larger than the expected noise could be used. DC of the input signal is blocked, in an action 306 of FIG. 3. It should be appreciated that the blocking of the DC of the input signal can be accomplished by using an AC coupling device such as a capacitor, for example capacitor C4 of FIG. 2. A voltage is subtracted from the amplitude of the input signal, in an action 308. For example, the voltage clamp Z2 subtracts a clamping voltage from the AC coupled first clock signal CLK_1 as illustrated with reference to FIG. 2. The amplitude of the modified signal is then limited in an action 310. In some embodiments a voltage clamp, such as voltage clamp Z1 of FIG. 2 achieves this functionality. This modified signal is applied to the control terminal of the switch, in an action 312. As shown in FIG. 2, the AC coupled first clock signal CLK_1 is modified by passing through the voltage clamp Z2, emerging with a reduced amplitude. Then, this modified signal is clamped by the voltage clamp Z1 and is applied to the gate terminal of the P type MOSFET acting as the switch S1a. These actions result in a switch control voltage that is noise resistant and avoids damaging the switch.

It should be appreciated that other types of voltage clamps may be devised with bipolar transistors, various types of MOSFET transistors, voltage references, amplifiers and other circuits. In some embodiments a Zener diode in series with a regular diode may be utilized for the voltage clamp, which results in an asymmetrical clamp having differing voltages depending on the direction. Other embodiments of the voltage clamp may employ an Application Specific Integrated Circuit (ASIC). It should be appreciated that the voltage clamp described above is not meant to be limiting as alternative voltage clamps achieving the functionality described herein may be utilized in the embodiments. Other types of filters may be devised with various circuits. Other types of couplings may be devised with various circuits. These alternative filters may be applied in variations of the above described circuits to provide the functionality of the filters described above.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A noise resistant, switch control circuit comprising:
a low pass filter configured to couple a low pass output of the low pass filter to a first terminal of a switch, the switch having the first terminal, a second terminal, and a control terminal;
a first voltage clamp coupled to the low pass filter, the first voltage clamp configured to couple to the control terminal of the switch and to limit a voltage of the control terminal relative to the first terminal to within a first clamping range;
a second voltage clamp coupled to an input terminal of the switch control circuit, the second voltage clamp configured to couple to the control terminal of the switch, the second voltage clamp further configured to reduce a level of a control voltage coupled to the second voltage clamp; and
a bias device configured to couple to the control terminal of the switch and to impress a biasing voltage to the control terminal.

2. The switch-control circuit of claim 1, further comprising:
a coupler configured to block DC (direct current) while coupling the control voltage to the second voltage clamp.

3. The switch-control circuit of claim 2, wherein the bias device is in cooperation with the coupler to form a further low pass filter.

4. The switch-control circuit of claim 1, wherein the bias device is coupled to the low pass filter.

5. The switch-control circuit of claim 1, wherein the switch includes a MOSFET (metal oxide semiconductor field effect transistor) having a gate as the control terminal of the switch.

6. The switch-control circuit of claim 1, wherein the first voltage clamp includes first back-to-back Zener diodes and the second voltage clamp includes second back-to-back Zener diodes.

7. The switch-control circuit of claim 1, wherein the low pass filter includes a resistor and a capacitor and the bias device includes a resistor coupled to an output of the low pass filter.

8. The switch-control circuit of claim 1, wherein the first clamping range is determined by first back-to-back Zener diodes included in the first voltage clamp and a second clamping range is determined by second back-to-back Zener diodes included in the second voltage clamp.

9. A noise resistant switching device, comprising:
a switch having a first terminal, a second terminal and a control terminal, wherein the first terminal and the second terminal are coupled together in response to the control terminal being within an activation voltage range relative to the first terminal;
an AC (alternating current) coupling device having a first terminal as an input terminal of the noise-resistant switching device;
a first voltage clamp coupled to the control terminal and the first terminal of the switch, the first voltage clamp arranged to clamp a voltage of the control terminal to a first clamping voltage relative to the first terminal of the switch;
a second voltage clamp coupled to a second terminal of the AC coupling device, the second voltage clamp coupled to the control terminal of the switch, the second voltage clamp configured to urge a voltage of the control terminal towards a voltage on the second terminal of the AC coupling device in response to the voltage on the second terminal of the AC coupling device being greater in magnitude than a second clamping voltage;
a low pass filter having an output coupled to the first terminal of the switch; and
a bias device coupled to the control terminal and the first terminal of the switch.

10. The noise resistant switching device of claim 9, wherein the AC coupling device includes a capacitor and the second voltage clamp includes back-to-back Zener diodes, the back-to-back Zener diodes being in series with the capacitor.

11. The noise resistant switching device of claim 9, wherein the switch includes a P type MOSFET (metal oxide semiconductor field effect transistor), with a gate of the MOSFET acting as the control terminal of the switch and wherein the first voltage clamp includes back-to-back Zener diodes coupled across a source of the MOSFET and the gate of the MOSFET.

12. The noise resistant switching device of claim 9, wherein the low pass filter includes a first resistor and a capacitor in series and the bias device includes a second resistor.

13. The noise resistant switching device of claim 9, wherein the first clamping voltage is set by first back-to-back Zener diodes and the second clamping voltage is set by second back-to-back Zener diodes.

14. The noise resistant switching device of claim 9, wherein the AC coupling device and the second voltage clamp are configured to receive an input signal at the input terminal of the noise resistant switching device, with the input signal having a peak-to-peak amplitude greater in magnitude than twice the second clamping voltage.

15. The noise resistant switching device of claim 9, wherein the control terminal of the switch has a bias voltage imparted by the bias device in response to an input signal at the input terminal of the noise resistant switching device having a peak to peak amplitude lower in magnitude than twice the second clamping voltage.

16. The noise resistant switching device of claim 9, wherein the switch and the bias device are configured to deactivate the switch in response to a clock signal being absent relative to the input terminal of the noise-resistant switching device.

17. A method for controlling a switch, the method comprising:
coupling a first terminal of a switch to an output of a low pass filter, the switch having the first terminal, a second terminal, and a control terminal;
biasing the control terminal of the switch to within one of an activating voltage range or a deactivating voltage range;
AC (alternating current) coupling an input signal, to produce an AC coupled version of the input signal;
voltage clamping the AC coupled version of the input signal, to produce a reduced AC coupled version of the input signal in response to the AC coupled version of the input signal exceeding a second clamping range;
voltage clamping the reduced AC coupled version of the input signal, to produce a voltage clamped AC coupled version of the input signal; and
applying the voltage clamped AC coupled version of the input signal to the control terminal of the switch.

18. The method of claim 17, further comprising:
activating the switch in response to the control terminal of the switch being within the activating voltage range; and
deactivating the switch in response to the control terminal of the switch being within the deactivating voltage range.

19. The method of claim 17, further comprising:
low pass filtering a voltage, using the low pass filter to produce a low pass filtered voltage; and
expressing the low pass filtered voltage on the first terminal of the switch.

20. The method of claim 17, wherein:
the voltage clamping the AC coupled version includes producing the reduced, AC coupled version of the input signal as the AC coupled version of the input signal reduced by a first amplitude; and
the voltage clamping the reduced AC coupled version includes limiting the voltage clamped AC coupled version of the input signal to a second amplitude.

* * * * *